United States Patent
Kuo

(10) Patent No.: US 6,797,635 B2
(45) Date of Patent: Sep. 28, 2004

(54) FABRICATION METHOD FOR LINES OF SEMICONDUCTOR DEVICE

(75) Inventor: Tung-Cheng Kuo, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 118 days.

(21) Appl. No.: 10/142,696

(22) Filed: May 8, 2002

(65) Prior Publication Data

US 2003/0186557 A1 Oct. 2, 2003

(30) Foreign Application Priority Data

Mar. 28, 2002 (TW) .......................................... 91106125

(51) Int. Cl.[7] .......................................... H01L 21/302
(52) U.S. Cl. .................... 438/706; 438/710; 438/712; 438/725; 430/297
(58) Field of Search ................................ 438/706, 710, 438/712, 714, 725; 430/297, 298, 702

(56) References Cited

U.S. PATENT DOCUMENTS 5,308,740 A * 5/1994 Templeton et al. ......... 430/311
6,069,090 A * 5/2000 Eriguchi .................... 438/714

* cited by examiner

Primary Examiner—Lan Vinh
(74) Attorney, Agent, or Firm—J. C. Patents

(57) ABSTRACT

A fabrication method for lines of a semiconductor device provides a substrate with a deposition layer already formed thereon, followed by forming a photoresist layer on the deposition layer. Photolithography is conducted with a mask to pattern the photoresist layer, wherein the photoresist layer is designed with the consideration of both the proximity effect and the microloading effect due to etching. Thereafter, using the patterned photoresist layer as an etching mask, an etching is conducted to form a plurality of lines. Since during the patterning of the photoresist layer, the proximity effect and the microlaoding effect are being considered, the difference in the linewidths between the dense feature region and the scattered feature region is minimized after the etching process.

9 Claims, 1 Drawing Sheet

FABRICATION METHOD FOR LINES OF SEMICONDUCTOR DEVICE

CROSS-REFERENCE TO RELATED APPLICATION

This application claims the priority benefit of Taiwan application serial no. 91106125, filed Mar. 28, 2002.

BACKGROUND OF THE INVENTION

1. Field of the Invention

The present invention relates to a fabrication method for a semiconductor device. More particularly, the present invention relates to a fabrication method for lines of a semiconductor device.

2. Background of the Invention

With the demand for higher levels of integration of semiconductor devices, the need for reduced device dimensions and patterns having a finer linewidth greatly increases. The photolithography technique in the semiconductor processing plays a significant role in influencing the density of semiconductor devices because processes including etching and doping are accomplished through photolithography. Thus, whether the integration of the semiconductor industry can be developed beyond a linewidth of 0.15 $\mu$m is determined by the advancement of the photolithography technique. In order to accommodate this demand, methods, for example, optical proximity correction (OPC) are being proposed to enhance the resolution of the photomask.

In general, in the manufacturing of the 0.18 $\mu$m linewidth and beyond, the light deflection problem becomes more serious as the dimensions of the holes and the lines are being reduced. Optical proximity correction is thus used to eliminate the deviation in the critical dimension (CD) resulted from the proximity effect. The proximity effect is due to, on one hand, the scattering of a light beam causing the light to enlarge when the light beam is incident on a wafer through the pattern of a mask. While on the other hand, the light beam is reflected from the semiconductor substrate of the wafer through the photoresist layer on the surface of the wafer, causing an interference with the incident light beam. The actual intensity of the exposure light on the photoresist layer is thus altered due to multiple exposures. This type of effect is especially obvious, as the critical dimension of a process becomes smaller; especially the critical dimension approaches the wavelength of the incident light.

OPC is conventionally used to improve the mask resolution such that the dimension of the photoresist subsequent to exposure is same as the expected dimension. However, the dimension of the pattern resulted from the etching process is usually different and deviated from the expected device dimension. Such deviation is due to the microloading effect resulted from the etching process subsequent to the photolithography process. The microloading effect is generally referred to the undue changes in the etching rate, shape or etching attribute. These undue changes are typically resulted from a higher etching rate in the ISO region than in the DENSE region, leading to deviation in the critical dimension and eventually in the dimension of the entire semiconductor device.

Conventionally, to resolve the microloading effect in an etching process the etching recipe is altered, for example, altering the etching gas, the power of the etching process, etc. However, to simply altering the etching method has a limited effect on mitigating the microloading effect. Moreover, the manufacturing processing becomes more complex.

SUMMARY OF THE INVENTION

Accordingly, the present invention provides a fabrication method for lines of a semiconductor device, wherein same linewidths are formed in regions of different densities.

The present invention also provides a fabrication method for lines of a semiconductor device, wherein problems of deviation in the device dimension are prevented.

The present invention further provides a fabrication method for lines of a semiconductor device, wherein the fabrication of lines of a semiconductor device can be simplified.

In accordance to the above and other objectives, the present invention provides a fabrication method for lines of a semiconductor device which comprises providing a deposition layer, followed by forming a photoresist layer on the deposition layer. A photolithography process is then conducted to pattern the photoresist layer using a mask, wherein the proximity effect and the microloading effect due to the etching process are taken into consideration in the design of the mask. Thereafter, using the patterned photoresist layer as an etching mask, the deposition layer is etched to form a plurality of lines, wherein these lines are formed in both the dense feature region and the scattered and isolated region. Thereafter, the patterned photoresist is removed.

The present invention provides a fabrication method for a pattern of a semiconductor device, which includes providing a substrate that comprises a deposition layer. A patterned photoresist layer is then formed on the deposition layer, wherein the patterned photoresist layer comprises a plurality of first patterns and second patterns for forming a plurality of lines, wherein a width of the first patterns is greater than a linewidth of the lines, a bottom width of the second patterns is same as the linewidth of the lines and a top width of the second patterns is smaller than the top width of the second patterns. Using the patterned photoresist layer as an etching mask, an etching is conducted on the deposition layer to form the plurality of lines. After this, the pattern photoresist layer is removed.

Since during the patterning of the photoresist layer, the proximity effect and the microloading effect resulted from the etching process are being considered, the difference in the linewidths between the dense feature region and the scattered and isolated feature region is minimized. Even in regions with different pattern density, the dimension of the resulted pattern is close to the expected pattern dimension.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
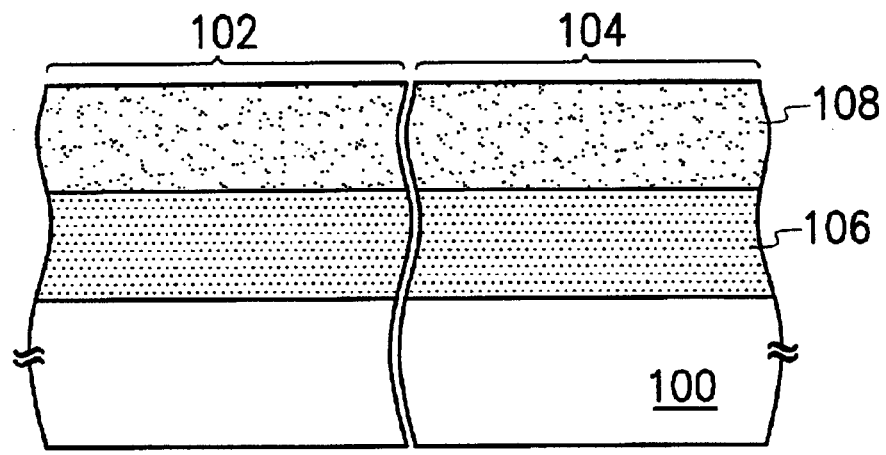
FIGS. 1A to 1C are schematic diagrams in cross-sectional to illustrate the manufacturing of lines of a semiconductor device according to one embodiment of the present invention.
Figure 1B:
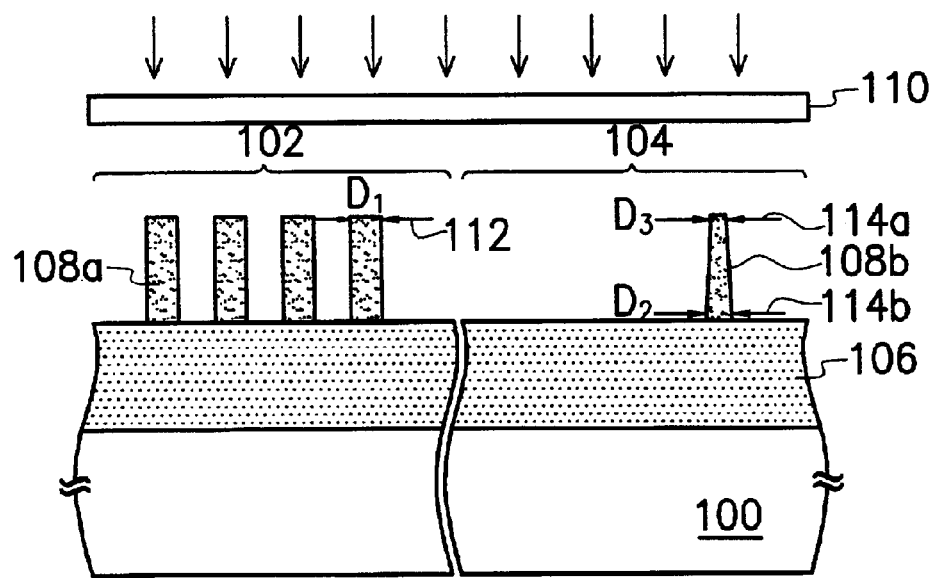
Figure 1C:
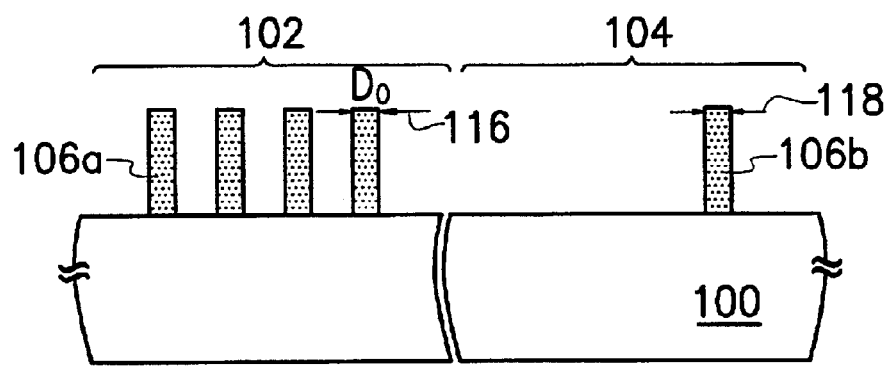

FIGS. 1A to 1C are schematic diagrams in cross-sectional to illustrate the manufacturing of lines of a semiconductor device according to one embodiment of the present invention.

As shown in FIG. 1A, a substrate 100 is provided. The substrate 100 includes a dense feature (DENSE) region 102 and a scattered and isolated feature (ISO) region 104. A layer 106 is further formed on the substrate 100. This layer 106 is, for example, a deposition layer, which can be a polysilicon layer. Thereafter, a photoresist layer 108 is formed on the layer 106.

Referring to FIG. 1B, using a mask 110, photolithography is conducted to pattern the photoresist layer 108, wherein the design of the mask 108 has taken the proximity effect and the microloading effect into consideration. The detail pattern of the mask 110 is omitted from FIG. 1B mostly because the pattern of the mask 110 can change accordingly. For example, different sizing patterns and scattering bars are added next to the lines in the ISO region 104 or the DENSE region 102 such that the linewidths of the photoresist after exposure vary according to the differences in pattern density to accommodate the microloading effect.

Still referring to FIG. 1B, assuming the linewidths in the DENSE region 102 are expected to be the same as the linewidths in the ISO region, the linewidths ($D_1$) 112 of the pattern of the photoresist layer 108a in the DENSE region 102 are to be greater than the desired linewidths 116 ($D_0$) (as shown in FIG. 1C) in order to eliminate the proximity effect and the microloading effect. Whereas in the ISO region 104, the widths 114b ($D_2$) of the bottom part the photoresist 108b pattern is same as the desired linewidths ($D_0$), while the widths 114a ($D_3$) of the top part of the photoresist 108b pattern are narrower than the widths 114b ($D_2$) of the bottom part.

Referring to FIG. 1C, using the patterned photoresist layer 108a and 108b (as shown in FIG. 1B) as etching masks, etching is performed on the underlying layer 106 to form a plurality of lines 106a and 106b, wherein these lines 106a and 106b are, for example, gates. Since both the proximity effect and the microloading effect resulted from etching are being considered during the design of the photoresist layer 108a and 108b, the difference in the linewidths between the lines 106a in the DENSE region 102 and the lines 106b in the ISO region 104 is minimized after the etching is completed. Thereafter, the patterned photoresist layer 108a and 108b is removed.

In accordance with the present invention, since both the proximity effect and the microloading effect resulting from etching are taken into consideration during the patterning of the photoresist layer, the differences in the linewidths between the DENSE region and the ISO region are minimized.

Further, since both the proximity effect and the microloading effect resulting from etching are taken into consideration during the patterning of the photoreist layer, the dimension of the resulting pattern is close to that of the desired pattern, irrespective the resulting pattern is in the DENSE region or in the ISO region.

Further, since both the proximity effect and the microloading effect resulting from etching are taken into consideration during the patterning of the photoresist layer, the fabrication of lines of a semiconductor device is thus simplified.

Further, since both the proximity effect and the subsequent microloading effect resulting from the etching process are taken into consideration during the patterning of the photoresist layer, the entire patterning process is simpler than the conventional approach.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a plurality of lines of a semiconductor device, comprising:

providing a substrate that comprises a layer, forming a photoresist layer on the layer;

patterning the photoresist layer by a photolithography process with a photomask to form a plurality of first patterns and second patterns for forming the plurality of lines, wherein a width of the first patterns is greater than a linewidth of the lines, a bottom width of the second patterns is same as the linewidth of the lines and a top width of the second patterns is smaller than the bottom width of the second patterns;

etching the layer to form the plurality of lines using the patterned photoresist layer as etching mask; and removing the patterned photoresist layer.

2. The method of claim 1, wherein the lines are formed having the same linewidth.

3. The method of claim 1, wherein the lines include gate structures.

4. The method of claim 1, wherein providing a substrate that comprises the layer includes forming a deposition layer on the substrate.

5. The method of claim 4, wherein forming the deposition layer includes forming a polysilicon layer.

6. A method for fabricating patterns of a semiconductor device, the method is applicable to form a plurality of densely packed lines having a first linewidth and a plurality of isolated lines having a second linewidth, comprising:

providing a layer on a substrate;

forming a patterned photoresist layer on the layer, the patterned photoresist layer comprises a plurality of dense patterns, for forming the densely packed lines and a plurality of scattered patterns for forming the isolated lines, wherein a width of the dense patterns is greater than the first linewidth, a bottom width of the scattered patterns is same as the second linewidth and a top width of the scattered patterns is narrower than the bottom width of the scattered patterns; and etching the layer using the patterned photoresist layer as an etching mask.

7. The method of claim 6, wherein subsequent to the etching process, the patterned photoresist layer is removed.

8. The method of claim 6, wherein providing the layer on a substrate includes fanning a deposition layer on the substrate.

9. The method of claim 8, wherein forming the deposition layer includes fanning a polysilicon layer.

* * * * *